US010816604B2

(12) United States Patent
Yang et al.

(10) Patent No.: US 10,816,604 B2
(45) Date of Patent: Oct. 27, 2020

(54) ESTIMATION OF STATE-OF-CHARGE FOR ZINC-BROMINE FLOW BATTERIES BY IN SITU OCV ANALYSIS

(71) Applicant: KOREA INSTITUTE OF ENERGY RESEARCH, Daejeon (KR)

(72) Inventors: Junghoon Yang, Daejeon (KR); Kyunam Jung, Daejeon (KR); Nari Yun, Nonsan-si (KR); Hyunju Lee, Ansan-si (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 229 days.

(21) Appl. No.: 15/953,500

(22) Filed: Apr. 16, 2018

(65) Prior Publication Data

US 2018/0313901 A1    Nov. 1, 2018

(30) Foreign Application Priority Data

Apr. 27, 2017    (KR) .................. 10-2017-0054439

(51) Int. Cl.
| | |
|---|---|
| G01R 31/382 | (2019.01) |
| G01R 31/36 | (2020.01) |
| H01M 8/18 | (2006.01) |
| H01M 8/04537 | (2016.01) |
| G01R 31/374 | (2019.01) |
| H01M 8/04276 | (2016.01) |

(52) U.S. Cl.
CPC ....... *G01R 31/382* (2019.01); *G01R 31/3648* (2013.01); *G01R 31/374* (2019.01); *H01M 8/04276* (2013.01); *H01M 8/04544* (2013.01); *H01M 8/04611* (2013.01); *H01M 8/188* (2013.01); *Y02E 60/528* (2013.01)

(58) Field of Classification Search
CPC .............. G01R 31/382; G01R 31/3855; G01R 31/3648; H01M 8/04544; H01M 8/188; H01M 8/18; H01M 8/184; H01M 2010/04271
See application file for complete search history.

(56) References Cited

U.S. PATENT DOCUMENTS

| | | | |
|---|---|---|---|
| 2014/0028260 A1* | 1/2014 | Goeltz | H01M 8/188 320/127 |
| 2016/0190604 A1* | 6/2016 | Evans | H01M 4/8803 429/520 |

OTHER PUBLICATIONS

Hyun Ju Lee, Dong-Won Kim, Jung Hoon Yang, "Estimation of State-of-Charge for Zinc-Bromine Flow Batteries by In Situ Raman Spectroscopy", Journal of The Electrochemical Society, 164 (4) A754-A759, Feb. 16, 2017. (Year: 2017).*

* cited by examiner

*Primary Examiner* — Jonathan G Jelsma
(74) *Attorney, Agent, or Firm* — Cantor Colburn LLP

(57) ABSTRACT

Disclosed are an apparatus and method for estimating a state-of-charge of a zinc flow battery by measuring a concentration of zinc ions contained in an electrolyte through an open-circuit voltage (OCV). The apparatus according to embodiments of the present invention can estimate effectively the state-of-charge of the zinc flow battery from the concentration of zinc ions measured through the OCV of the working electrode with respect to the reference electrode when the measuring electrodes are installed in the cathode electrolyte tank or the anode electrolyte tank.

7 Claims, 5 Drawing Sheets

ESTIMATION OF STATE-OF-CHARGE FOR ZINC-BROMINE FLOW BATTERIES BY IN SITU OCV ANALYSIS

TECHNICAL FIELD

The present invention relates to a flow battery and, more particularly, to an apparatus and method for estimating a state-of-charge of a zinc flow battery by measuring a concentration of zinc ions contained in an electrolyte through an open-circuit voltage (OCV).

BACKGROUND

In order to solve air pollution caused by the use of fossil fuels, research and development on renewable energy such as solar energy or wind energy have been actively conducted all over the world. As the proportion of renewable energy gradually increases, it is important to efficiently manage surplus energy produced during peak hours.

For managing this surplus energy, a very high energy storage system is needed. A redox flow battery (RFB) is one of economical systems for large-scale energy storage in terms of cost efficiency, long lifetime, and large energy capacity.

A zinc-bromine flow battery (ZBB) has low electrolyte cost and high energy density, thus known as one of cost-effective redox flow batteries in the art.

This zinc-bromine flow battery uses the redox reaction of $Zn/Zn^{2+}$ and $Br/Br^-$ as shown in Equation 1 below.

$2Br^- \leftrightarrow Br_2 + 2e^- (E^0=1.07V$ vs. SHE) at the positive electrode $Zn^{2+} + 2e^- \leftrightarrow Zn(E^0=-0.76V$ vs. SHE) at the negative electrode [Equation 1]

In general, some quaternary ammonium compounds are used to capture the bromine molecules generated at the positive electrode (anode) during charging. These quaternary ammonium compounds dissolve in an aqueous solution, but form water-insoluble polybromide after bromine capture. This reaction leads to a water-soluble zinc bromide phase and a water-insoluble polybromide phase, thus causing an anode electrolyte having a complicated configuration.

With such a complicated configuration, the zinc-bromine flow battery has difficulty in analyzing the electrolyte which is one of important components for stable operation.

In particular, the zinc-bromine flow battery has a problem that it is difficult to accurately estimate the state-of-charge (SOC) of the electrolyte.

That is, since the concentration of bromine ions is not constant in the zinc-bromine flow battery, it is difficult to estimate the state-of-charge by using the concentration of bromine ions.

Further, in case of estimating the state-of-charge through the concentration of zinc ions contained in the electrolyte, the zinc-bromine flow battery essentially requires the use of a metal zinc electrode to achieve electrochemical equilibrium with zinc ions. However, when the metal zinc electrode is used for analysis, it has a characteristic of being corroded and/or dissolved by the electrolyte and may cause a change in the concentration of zinc ions in the electrolyte.

SUMMARY

Accordingly, it is an object of the present invention to provide an apparatus and method for effectively estimating a state-of-charge of a zinc flow battery that contains zinc ions in an electrolyte.

According to embodiments of the present invention, when a zinc flow battery includes a unit cell having a cathode module and an anode module, a cathode electrolyte tank connected to the cathode module of the unit cell and storing a cathode electrolyte containing zinc ions, and an anode electrolyte tank connected to the anode module of the unit cell and storing an anode electrolyte containing zinc ions, an apparatus for estimating a state-of-charge of the zinc flow battery is configured to comprise measuring electrodes and an estimator. The measuring electrodes are installed in at least one of the cathode electrolyte tank and the anode electrolyte tank and including a working electrode, a reference electrode, and a counter electrode. The estimator supplies a constant current to the measuring electrodes for a predetermined time before measurement so that zinc is electro-deposited on the working electrode through the zinc ions contained in the cathode electrolyte or the anode electrolyte. Also, the estimator estimates the state-of-charge by measuring an open-circuit voltage (OCV) of the working electrode with respect to the reference electrode.

In the apparatus according to embodiments of the present invention, the working electrode may be made of a material including carbon, gold, platinum, or iridium.

In the apparatus according to embodiments of the present invention, the estimator may apply a constant current 30~40 $mA/cm^2$ to the measuring electrodes for 400~800 seconds before measurement so that the zinc is electro-deposited on the working electrode through the zinc ions.

In the apparatus according to embodiments of the present invention, the estimator may calculates a concentration of zinc ions through an equation, given below, from the measured OCV, and estimating the state-of-charge through the calculated concentration of zinc ions.

$E = E^{0'} + RT/nF \ln(C_{Zn2+})$ [Equation]

Here, E is the measured OCV, E0' is a formal potential, R is a gas constant, T is an absolute temperature, n is a unit reaction electron number, F is a Faraday constant, and $C_{Zn2+}$ is the concentration of zinc ions ($Zn^{2+}$).

In the apparatus according to embodiments of the present invention, the measuring electrodes may be installed in each of the cathode electrolyte tank and the anode electrolyte tank.

In the apparatus according to embodiments of the present invention, the estimator may estimate a final state-of-charge through an average of the state-of-charge estimated in the cathode electrolyte tank and the state-of-charge estimated in the anode electrolyte tank.

According to embodiments of the present invention, a method for estimating a state-of-charge of a zinc flow battery uses the above-described apparatus according to embodiments of the present invention.

The apparatus according to embodiments of the present invention can estimate effectively the state-of-charge of the zinc flow battery from the concentration of zinc ions measured through the OCV of the working electrode with respect to the reference electrode when the measuring electrodes are installed in the cathode electrolyte tank or the anode electrolyte tank.

In addition, the apparatus according to embodiments of the present invention can estimate effectively the state-of-charge of the zinc flow battery while preventing the phenomenon of metal corrosion by supplying a constant current to the measuring electrodes for a predetermined time before measurement such that zinc is electro-deposited on the working electrode through zinc ions contained in the cathode electrolyte or the anode electrolyte.

DETAILED DESCRIPTION

Figure 1:
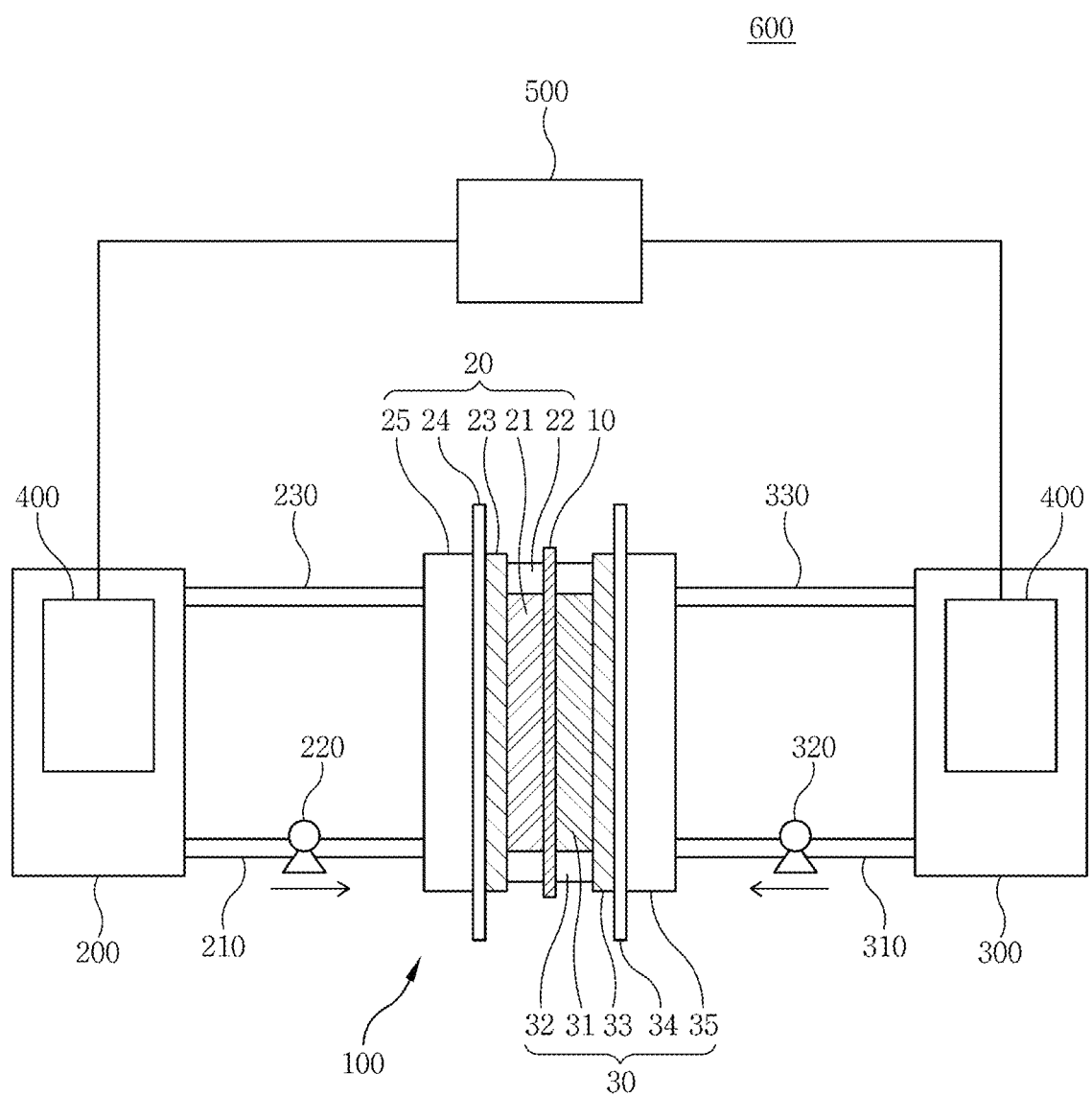
FIG. 1 is a schematic diagram illustrating an apparatus for estimating a state-of-charge of a zinc flow battery according to the present invention.

Hereinafter, embodiments of the present invention will be described in detail with reference to the accompanying drawings.

In the following description of embodiments, descriptions of techniques that are well known in the art and not directly related to the present disclosure are omitted. This is to clearly convey the subject matter of the present disclosure by omitting an unnecessary explanation.

For the same reason, some elements in the drawings are exaggerated, omitted, or schematically illustrated. Also, the size of each element does not entirely reflect the actual size. In the drawings, the same or corresponding elements are denoted by the same reference numerals.

In addition, terms used herein are defined in consideration of functions of this disclosure and may be varied depending on a user or an operator's intention or custom. Therefore, the definition should be made based on the contents throughout this description.

Figure 2:
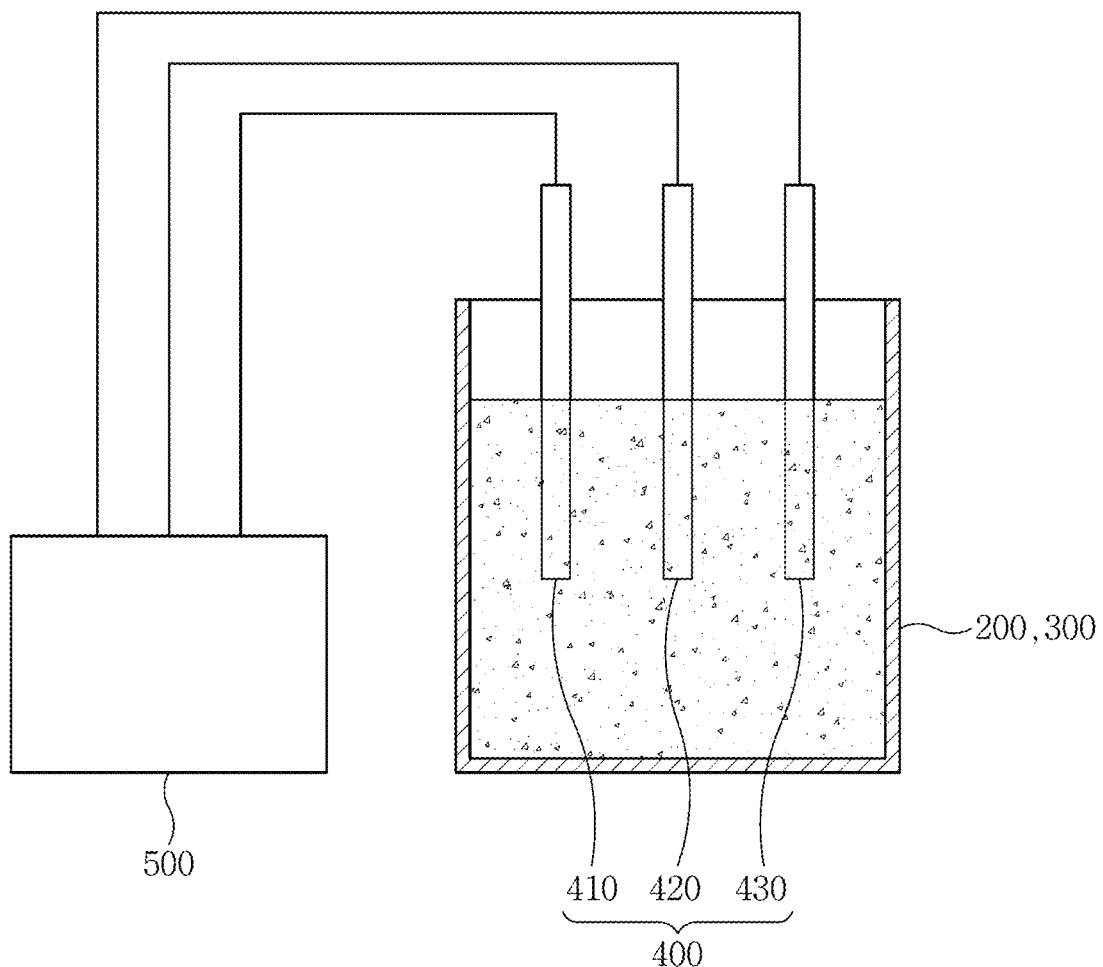
FIG. 2 is a schematic diagram illustrating measuring electrodes of a zinc flow battery according to the present invention.

FIG. 1 is a schematic diagram illustrating an apparatus for estimating a state-of-charge of a zinc flow battery according to the present invention, and FIG. 2 is a schematic diagram illustrating measuring electrodes of a zinc flow battery according to the present invention.

Referring to FIGS. 1 and 2, an apparatus 600 is configured to estimate a state-of-charge of a zinc flow battery that includes a unit cell 100, a cathode electrolyte tank 200, and an anode electrolyte tank 300. This apparatus 600 includes measuring electrodes 400 and an estimator 500.

The unit cell 100 is composed of a separator 10, a cathode module 20, and an anode module 30. The cathode module 20 and the anode module 30 are spaced apart from each other, and the separator 10 is interposed between the cathode module 20 and the anode module 30.

The separator 10 separates a cathode electrolyte and an anode electrolyte from each other during charging and discharging, and selectively transfers ions only during charging and discharging. The separator 10 is well known in the art and not limited to a particular form. For example, the separator 10 may use a polypropylene (PP)-based porous film. Also, the separator 10 may use a cation exchange membrane obtained by sulfonating a styrene-divinylbenzene copolymer, a cation exchange membrane obtained by introducing a sulfonic acid group on the basis of a copolymer of tetrafluoroethylene and perfluorosulfonylethoxyvinylether, a cation exchange membrane composed of a copolymer of tetrafluoroethylene and perfluorovinylether having a carboxy group in a side chain, a cation exchange membrane obtained by introducing a sulfonic acid group on the basis of an aromatic polysulfone copolymer, an anion exchange membrane obtained by introducing and aminating a chloromethyl group on the basis of a copolymer of styrene-divinylbenzene, a quaternary pyridinium anion exchange membrane of a copolymer of vinylpyridine-divinylbenzene, an anion exchange membrane obtained by introducing and aminating a chloromethyl group on the basis of an aromatic polysulfone copolymer, or the like.

The cathode module 20 is disposed on the opposite side of the anode module 30 with respect to the separator 10, and includes a cathode 21, a first flow frame 22, a first bipolar plate 23, and a first current collector 24. The cathode module 20 may be fixed by a first cell frame 25.

The cathode 21 may be inserted and disposed inside the first flow frame 22. The cathode 21 may be formed of, but not limited to, nonwoven fabric, carbon fiber, or carbon paper. Preferably, the cathode 21 may be a carbon felt electrode formed of polyacrylonitrile (PAN) series or rayon series.

The first flow frame 22 in which the cathode 21 is inserted and disposed may have a flow channel for a flow of a cathode electrolyte to the cathode 21. The first flow frame 22 may be formed of a plastic resin such as polyethylene (PE), polypropylene (PP), polystyrene (PS), or vinyl chloride (PVC).

The first bipolar plate 23 is attached to the outside of the first flow frame 22. The first bipolar plate 23 may be a conductive plate. For example, the first bipolar plate 23 may be a graphite plate.

The first current collector 24 is a path through which electrons move. That is, the first current collector 24 receives electrons from the outside during charging, or emits electrons to the outside during discharging. For example, the first current collector 24 may be formed of copper or brass.

The first cell frame 25 may fix the cathode 21, the first flow frame 22, the first bipolar plate 23, and the first current collector 24. The first cell frame 25 may have an electrolyte inlet and an electrolyte outlet.

The anode module 30 is disposed on the opposite side of the cathode module 20 with respect to the separator 10, and includes an anode 31, a second flow frame 32, a second bipolar plate 33, and a second current collector 34. The anode module 30 may be fixed by the second cell frame 35.

The configuration of the anode module 30 is substantially the same as that of the cathode module 20, so that a detailed description thereof will be omitted.

The cathode electrolyte tank 200 stores the cathode electrolyte to be supplied to the cathode module 20 of the unit cell 100. In addition, the cathode electrolyte tank 200 is connected to the electrolyte inlet and the electrolyte outlet of the first cell frame 25 through a first inflow pipe 210 and a first outflow pipe 230, so that the cathode electrolyte is circulated. Further, a first pump 220 for to circulating the cathode electrolyte may be installed between the first inflow pipe 210 and the first cell frame 25.

The anode electrolyte tank 300 stores the anode electrolyte to be supplied to the anode module 30 of the unit cell 100. The anode electrolyte tank 300 is connected to the electrolyte inlet and the electrolyte outlet of the second cell frame 35 through a second inflow pipe 310 and a second outflow pipe 330, so that the anode electrolyte is circulated. Further a second pump 320 for to circulating the anode electrolyte may be installed between the second inflow pipe 310 and the second cell frame 35.

Herein, the cathode electrolyte and the anode electrolyte may be ionized water having zinc ions, bromine ions, and chlorine ions. For example, the cathode electrolyte and the anode electrolyte may include zinc bromide (ZnBr$_2$), zinc chloride (ZnCl$_2$), bromine, or MEP-Br (1-ethyl-1-methyl-pyrrolidinium bromide).

The measuring electrodes 400 may be installed in at least one of the cathode electrolyte tank 200 and the anode electrolyte tank 300. The measuring electrodes 400 include a working electrode 410, a reference electrode 420, and a counter electrode 430. Preferably, the measuring electrodes 400 may be installed in each of the cathode electrolyte tank 200 and the anode electrolyte tank 300.

The working electrode 410 is an electrode to be used for measurement in the cathode electrolyte tank 200 and/or the anode electrolyte tank 300. For measurement, an electric current flows between the working electrode 410 and the counter electrode 430. An electric potential of the working electrode 410 is measured by the estimator 500 with reference to the reference electrode 420. At this time, a potential difference between the working electrode 410 and the reference electrode 420 can be accurately measured regardless of the value of an electric current flowing by an electrode reaction.

Meanwhile, since the cathode electrolyte or the anode electrolyte is acidic, an electrode made of a metal such as aluminum or iron which reacts with an acid may cause a problem that the electrode melts down.

Therefore, the working electrode 410 may be made of a material that does not react with the acid. For example, the working electrode 410 may include carbon, gold, platinum, or iridium.

In order to electro-deposit metal zinc on a surface of the working electrode 410, the estimator 500 may apply a constant current for a predetermined time before measurement. Then, zinc ions contained in the electrolyte can be electro-deposited on the working electrode. For example, the estimator 500 may apply a constant current of 30 to 40 mA/cm$^2$ for 400 to 800 seconds before measurement to deposit zinc on the working electrode through zinc ions.

When a constant current is applied to the measuring electrodes 400, the estimator 500 may analyze a chemical response of the zinc flow battery. That is, the estimator 500 may supply a constant current to the measuring electrodes 400 and measure an open-circuit voltage (OCV) of the working electrode 410 with respect to the reference electrode 420. Then, the estimator 500 may calculate the concentration of zinc ions through the measured OCV.

After the OCV measurement is completed, the zinc deposited on the working electrode 410 dissolves again by the electrolyte during normal charging/discharging. Therefore, the concentration of zinc ions contained in the electrolyte does not change.

The estimator 500 may calculate the concentration of zinc ions through the Nernst equation. That is, from the measured OCV, the estimator 500 can calculate the concentration of zinc ions through Equation 2 given below.

$$E=E^{0\prime}+RT/nF \ln(C_{Zn2+})$$ [Equation 2]

Here, E is the measured OCV. Also, E0' is the formal potential, R is the gas constant, T is the absolute temperature, n is the unit reaction electron number, F is the Faraday constant, and $C_{Zn2+}$ is the concentration of $Zn^{2+}$.

When the measuring electrodes 400 are installed in each of the cathode electrolyte tank 200 and the anode electrolyte tank 300, the estimator 500 may estimate a final state-of-charge through an average of the state-of-charge estimated in the cathode electrolyte tank 200 and the state-of-charge estimated in the anode electrolyte tank 300.

Figure 3:
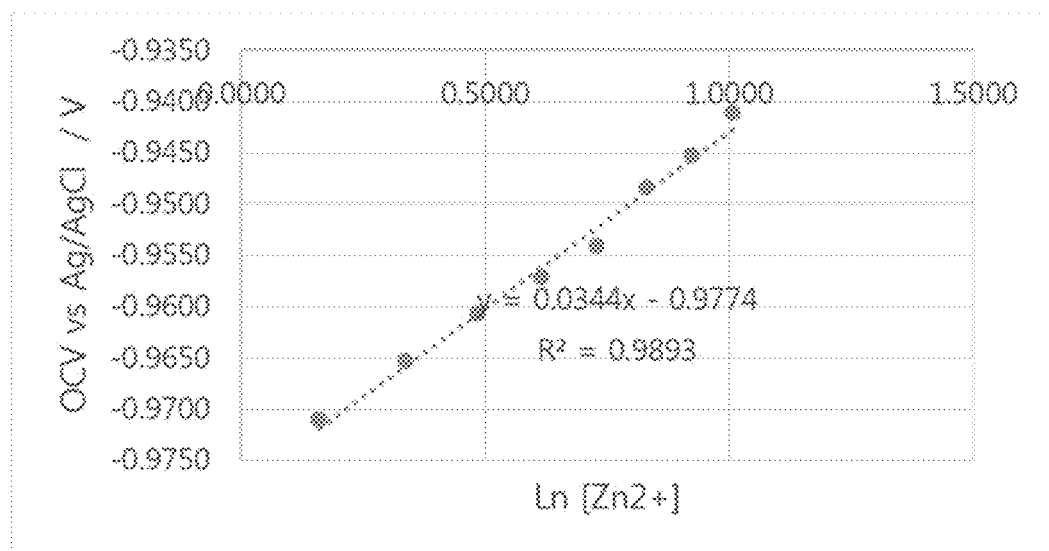
FIG. 3 is a graph showing the relationship between the concentration of zinc ions and an OCV.

FIG. 3 is a graph showing the relationship between the concentration of zinc ions and an OCV.

Referring to FIG. 3, it can be seen that the concentration of zinc ions and the OCV are proportional to each other. Therefore, the concentration of zinc ions can be calculated through OCV measurement.

Figure 4:
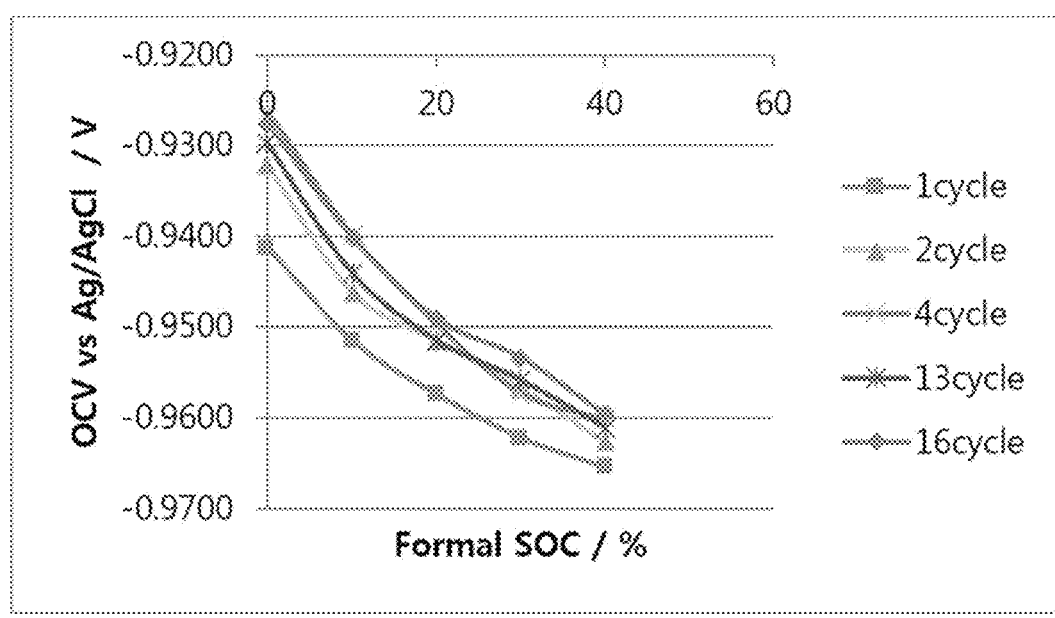
FIG. 4 is a graph showing OCV results of a cathode electrolyte obtained through an apparatus for estimating a state-of-charge of a zinc flow battery according to an embodiment of the present invention.

FIG. 4 is a graph showing OCV results of a cathode electrolyte obtained through an apparatus for estimating a state-of-charge of a zinc flow battery according to an embodiment of the present invention.

Referring to FIG. 4, the OCV change according to the applied SOC for the cathode electrolyte was measured depending on cycles. As a result, it can be seen that the OCV decreases uniformly as the applied SOC increases. This is because zinc ions are consumed in the electrolyte as the charging progresses. Therefore, the state-of-charge can be quantitatively estimated by measuring the OCV of the cathode electrolyte.

Figure 5:
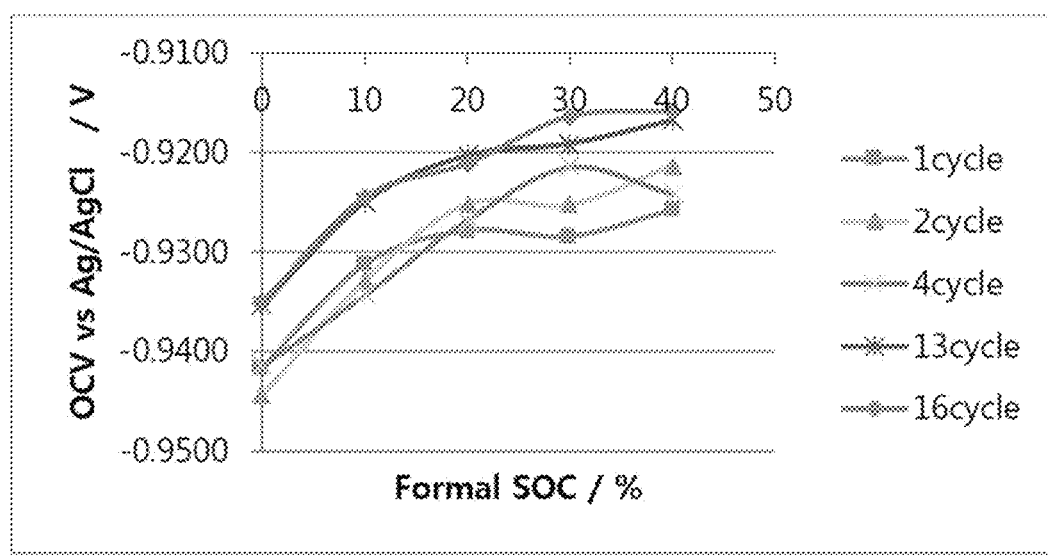
FIG. 5 is a graph showing OCV results of an anode electrolyte obtained through an apparatus for estimating a state-of-charge of a zinc flow battery according to an embodiment of the present invention.

FIG. 5 is a graph showing OCV results of an anode electrolyte obtained through an apparatus for estimating a state-of-charge of a zinc flow battery according to an embodiment of the present invention.

Referring to FIG. 5, the OCV change according to the applied SOC for the anode electrolyte was measured depending on cycles. As a result, it can be seen that the OCV increases uniformly as the applied SOC increases. This is presumably due to the fact that zinc ions migrate from the cathode electrolyte to the anode electrolyte in the form of $ZnBr_3^-$ or $ZnBr_4^{2-}$ during the charging process. Therefore, the state-of-charge can be estimated by measuring the OCV of the anode electrolyte.

Although the above-described embodiment employs the zinc-bromine flow battery, this is exemplary only and not to be construed as a limitation. The above-described embodiment may also be applied to all flow batteries including zinc.

While this disclosure has been particularly shown and described with reference to an exemplary embodiment thereof, it will be understood by those skilled in the art that various changes in form and details may be made therein without departing from the scope of the present invention as defined by the appended claims.

What is claimed is:

1. An apparatus for estimating a state-of-charge of a zinc flow battery, wherein the zinc flow battery includes a unit cell having a cathode module and an anode module, a cathode electrolyte tank connected to the cathode module of the unit cell and storing a cathode electrolyte containing zinc ions, and an anode electrolyte tank connected to the anode module of the unit cell and storing an anode electrolyte containing zinc ions, the apparatus comprising:

measuring electrodes installed in at least one of the cathode electrolyte tank and the anode electrolyte tank and including a working electrode, a reference electrode, and a counter electrode; and an estimator configured to supply a constant current to the measuring electrodes for a predetermined time before measurement of an open-circuit voltage (OCV) of the working electrode with respect to the reference electrode such that zinc is electro-deposited on the working electrode through the zinc ions contained in the cathode electrolyte or the anode electrolyte, and configured to estimate the state-of-charge by measuring the open-circuit voltage (OCV) of the working electrode with respect to the reference electrode.

2. The apparatus of claim 1, wherein the working electrode is made of a material including carbon, gold, platinum, or iridium.

3. The apparatus of claim 1, wherein the estimator is configured to apply a constant current of 30 to 40 mA/cm$^2$ to the measuring electrodes for 400 to 800 seconds before measurement so that the zinc is electro-deposited on the working electrode through the zinc ions.

4. The apparatus of claim 1, wherein the estimator is configured to calculate a concentration of zinc ions through an equation, given below, from the measured OCV, and is configured to estimate the state-of-charge through the calculated concentration of zinc ions;

$$E=E^{0'}+RT/nF \ln(C_{zn2+}) \qquad \text{[Equation]}$$

here, E is the measured OCV, E0' is a formal potential, R is a gas constant, T is an absolute temperature, n is a unit reaction electron number, F is a Faraday constant, and Czn2+ is the concentration of zinc ions (Zn2+).

5. The apparatus of claim 1, wherein the measuring electrodes are installed in each of the cathode electrolyte tank and the anode electrolyte tank.

6. The apparatus of claim 5, wherein the estimator is configured to estimate a final state-of-charge through an average of the state-of-charge estimated in the cathode electrolyte tank and the state-of-charge estimated in the anode electrolyte tank.

7. A method for estimating a state-of-charge of a zinc flow battery, the method comprising:

supplying, from an estimator, a constant current to measuring electrodes for a predetermined time before measurement of an open-circuit voltage (OCV) of a working electrode of the measuring electrodes with respect to a reference electrode of the measuring electrodes such that zinc is electro-deposited on the working electrode through zinc ions contained in a cathode electrolyte containing the zinc ions or an anode electrolyte containing the zinc ions, and estimating, with the estimator, the state-of-charge by measuring the open-circuit voltage (OCV) of the working electrode with respect to the reference electrode, wherein the zinc flow battery includes a unit cell having a cathode module and an anode module, a cathode electrolyte tank connected to the cathode module of the unit cell and storing the cathode electrolyte, and an anode electrolyte tank connected to the anode module of the unit cell and storing the anode electrolyte, and wherein an apparatus for estimating the state-of-charge of the zinc flow battery comprises the measuring electrodes installed in at least one of the cathode electrolyte tank and the anode electrolyte tank and including the working electrode, the reference electrode, and a counter electrode, and the estimator.

* * * * *